(12) United States Patent
Kim et al.

(10) Patent No.: US 6,479,755 B1
(45) Date of Patent: Nov. 12, 2002

(54) PRINTED CIRCUIT BOARD AND PAD APPARATUS HAVING A SOLDER DEPOSIT

(75) Inventors: Haeng-Il Kim, Kyunggi-do (KR); Gun-Yong Lee, Kyunggi-do (KR); Kwang-Soo Jung, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 99 days.

(21) Appl. No.: 09/635,490

(22) Filed: Aug. 9, 2000

(30) Foreign Application Priority Data

Aug. 9, 2000 (KR) .............................. 99-32571

(51) Int. Cl.[7] .............................. H05K 1/09; H05K 1/11
(52) U.S. Cl. .................... 174/250; 174/253; 174/257; 361/777; 361/779; 228/180.21; 29/840; 29/844
(58) Field of Search ................................ 361/774, 777, 361/779; 174/250, 253, 257, 261; 257/775, 779; 228/180.21, 180.22; 29/840, 842, 843, 857, 860, 844

(56) References Cited

U.S. PATENT DOCUMENTS

| | | | | |
|---|---|---|---|---|
| 3,517,279 A | * | 6/1970 | Ikeda et al. .................. | 361/777 |
| 3,770,874 A | * | 11/1973 | Krieger et al. ............... | 361/779 |
| 3,823,469 A | * | 7/1974 | Hegarty et al. ......... | 228/180.22 |
| 3,887,760 A | * | 6/1975 | Krieger et al. ............... | 361/779 |
| 4,413,309 A | * | 11/1983 | Takahashi et al. .......... | 361/777 |
| 4,645,114 A | | 2/1987 | Van Den Brekel et al. | |
| 4,870,225 A | | 9/1989 | Anao et al. | |
| 4,883,920 A | * | 11/1989 | Tanabe et al. ............... | 361/777 |
| 4,893,216 A | * | 1/1990 | Hagner ........................ | 361/774 |
| 5,303,122 A | | 4/1994 | Adams, Jr. et al. | |
| 5,330,096 A | | 7/1994 | Belanger, Jr. | |
| 5,406,458 A | | 4/1995 | Schütt | |
| 5,428,505 A | | 6/1995 | Sakemi et al. | |
| 5,446,244 A | | 8/1995 | Kawanabe et al. | |
| 5,453,581 A | | 9/1995 | Liebman et al. | |
| 5,453,582 A | * | 9/1995 | Amano et al. ............... | 174/260 |
| 5,468,920 A | | 11/1995 | August | |
| 5,511,306 A | | 4/1996 | Denton et al. | |
| 5,534,667 A | | 7/1996 | Miyamoto et al. | |
| 5,567,648 A | * | 10/1996 | Gupta .................... | 228/180.22 |
| 5,825,628 A | | 10/1998 | Garbelli et al. | |
| 5,842,274 A | * | 12/1998 | Modl et al. ............ | 228/180.21 |
| 5,866,949 A | | 2/1999 | Schueller | |
| 5,875,102 A | | 2/1999 | Barrow | |
| 5,892,290 A | | 4/1999 | Chakravorty et al. | |
| 5,949,651 A | | 9/1999 | Barrow | |
| 6,259,608 B1 | * | 7/2001 | Berardinelli et al. ........ | 361/779 |
| 6,292,372 B1 | * | 9/2001 | Lin et al. .................... | 361/774 |

* cited by examiner

Primary Examiner—David L. Talbott
Assistant Examiner—John B. Vigushin
(74) Attorney, Agent, or Firm—Robert E. Bushnell, Esq.

(57) ABSTRACT

A printed circuit board and a pad apparatus having a solder deposit formed on the pad apparatus by using a mask having a slit are provided. The slit has the same shape as the solder deposit. The solder deposit includes first and second end portions individually shaped and sized to completely cover at an end portion of the pad a predetermined area of an end portion of the pad, the area defined by both the entire width of the pad and a predetermined length from the end of the pad. A connection web extends between the two end portions to integrate the two end portions into a single structure and is a longitudinal part having a width smaller than any one of both the width of the pad and the width of each of the two end portions. First and second trapezoidal portions are respectively formed at junctions between opposite ends of said connection web and one of the two end portions. The mask has a slit formed at a position corresponding to the position of the solder deposit. This slit includes first and second end opening parts corresponding to the two end portions of the solder deposit, a web opening part corresponding to the connection web, and first and second trapezoidal opening parts respectively formed at junctions between opposite ends of said web opening part and said two end opening parts and corresponding to the first and second trapezoidal portions of the solder deposit.

31 Claims, 9 Drawing Sheets

PRINTED CIRCUIT BOARD AND PAD APPARATUS HAVING A SOLDER DEPOSIT

CLAIM OF PRIORITY

This application makes reference to, incorporates the same herein, and claims all benefits accruing under 35 U.S.C. §119 from an application for PRINTED CIRCUIT BOARD AND MASK FOR SCREEN PRINTING OF THE BOARD earlier filed in the Korean Industrial Property Office on the 9th of Aug. 1999 and there duly assigned Ser. No. 32571/1999.

BACKGROUND OF THE INVENTION

1. Field of the Invention

The present invention relates to a printed circuit board and pad apparatus having a solder deposit, and more particularly, to a printed circuit board and pad apparatus having a solder deposit formed on the pad apparatus by using a mask having a slit having wide ends, a narrow web, and tapered portions connected between the narrow web and one of the wide ends.

2. Description of the Prior Art

A surface mounted device ("SMD"), such as a resistor, a capacitor, an inductor, a jumper, etc, includes a plurality of conductive leads mounted on and electronically connected to a plurality of conductive pads formed on a printed circuit board ("PCB"). The pads includes two opposite and spaced-apart conductive ends and a nonconductive intermediate portion disposed between the two opposite and spaced-apart conductive ends. The SMD is located between the two opposite and spaced-apart conductive ends and on the non-conductive intermediate portion while each lead of the SMD is seated on each opposite conductive end. The SMD is electrically connected to the pads of the PCB by soldering the leads of the SMD to the pads. Each pad has a solder deposit for electrically and firmly connecting the pad to the lead. The solder deposit has been typically formed on the pads of the PCB using a mask, such as a "mesh" or a "stencil."

The SMD has evolved to a variety of semiconductor devices, such as plastic quad flat packages (PQFPs) and quad flat packages (QFPs), and a plurality of expansion connectors. The semiconductor devices and connectors includes a plurality of leads extended from a main body of the semiconductor devices and connectors and having a very small It ad pitch between the adjacent leads pin compared to other types of semiconductor devices and connectors. Due to the small lead pitch, the semiconductors and connectors are undesirably short-circuited since a solder applied to each pair of the pad and the lead easily and electrically connect the lead to the adjacent lead, the pad to the adjacent pad, or the pad to the adjacent lead during a soldering process. Particularly, in the case of semiconductor devices or connectors having a lead pitch less than 0.5 mm (millimeters), the defective soldering of the adjacent leads of the semiconductor devices and connectors or the adjacent pads of the PCB causes a short circuit and leads to an entire defective unit containing the PCB and the semiconductor devices or connectors.

U.S. Pat. No. 4,645,114 entitled Shaped Solder Pad For Surface Mounting Electronic Devices And A Surface Mounting Portion Incorporating Such Shaped Pads to Van Den Brekel et al., U.S. Pat. No. 5,303,112 entitled Printed Circuit Board Having A Commonized Pad Which Different Sized Surface Mounted Devices Can Be Mounted to Adams, Jr. et al., U.S. Pat. No. 4,870,225 entitled Mounting Arrangement Of Chip Type Component Onto Printed Circuit Board to Anao et al., U.S. Pat. No. 5,330,096 entitled Method Of Wave Soldering With Unique Solder Pad Configuration to Belanger, Jr., U.S. Pat. No. 5,406,458 entitled Printed Circuit Board Having Tapered Contact Pads For Surface Mounted Electrical Components to Schutt, U.S. Pat. No. 5,453,581 entitled Pad Arrangement For Surface Mount Components to Liebman et al., and U.S. Pat. No. 5,825,628 entitled Electronic Package With Enhanced Pad Design to Garbelli et al. disclose at least two conductive end portions spaced-apart from each other, a nonconductive portion disposed between the two opposite end portions, and two leads each located on each corresponding conductive end portion. These references, however, do not show particular shape of a pad having a solder deposit assigned to a lead and preventing a short circuit formed between the adjacent leads, the adjacent pad, or the adjacent lead and pad.

Although U.S. Pat. No. 5,428,505 entitled Printed Circuit Board to Sakemi et al., U.S. Pat. No. 5,446,244 entitled Printed Wiring Pattern to Kawanabe et al., U.S. Pat. No. 5,534,667 entitled Printed Circuit Board Having Zig-Zag Contact Arrangement to Miyamoto et al., and U.S. Pat. No. 5,468,920 entitled Printed Circuit Board Having Raised Conductor Pads to August disclose a pad and a lead connected to the pad, these references fail to show a particular shape of a pad preventing a short circuit formed between the adjacent leads or the adjacent pad and uniformly applying a solder to the pad by using a mask having a slit identical to the particular shape of the pad.

U.S. Pat. No. 5,511,306 entitled Masking Of Circuit Board Vias to Reduce Heat-Induced Board And Chip Carrier Package Warp During Wavesolder Process to Denton et al., U.S. Pat. No. 5,866,940 entitled Chip Scale Ball Grid Array For Integrated Circuit Packaging to Schueller, U.S. Pat. No. 5,875,102 entitled Eclipse Via In Pad Structure to Barrow, and U.S. Pat. No. 5,892,290 entitled Highly Reliable And Planar Ball Grid Array Package to Chakravorty et al. disclose a variety of pad formed on a ball grid array or a quad flat pack. Also, these references do not show a pad having a solder deposit preventing a short circuit formed between the adjacent leads or the adjacent pad and uniformly applying a solder to the pad by using a mask having a slit identical to the particular shape of the solder deposit of the pad.

SUMMARY OF THE INVENTION

It is an object of the present invention to provide a pad apparatus formed on a printed circuit board able to prevent a surface mounted device having a plurality of narrow leads from being electrically connected between the leads during soldering of each lead of the surface mounted device on a solder deposit of the pad apparatus.

It is another object to provide a pad apparatus formed on a printed circuit board able to connect leads of a surface mounted device to the printed circuit board without causing a short circuit between the adjacent leads, the adjacent pads, or the adjacent lead and pad.

It is yet another object to provide a pad apparatus formed on a printed circuit board able to prevent a solder deposit formed on the pad apparatus from flowing over outside the pad apparatus during mounting of a surface mounted device having a plurality of narrow leads on the printed circuit board.

It is still another object to provide a process of uniformly applying a solder on an entire area of a solder deposit of the pad apparatus through a mask including a slit having the same shape as the solder deposit.

It is a further object to provide a pad apparatus formed on a printed circuit board able to prevent the pad apparatus from blocking a solder to be uniformly formed on an entire area of a solder deposit of the pad apparatus.

It is also an object to provide a pad apparatus formed on a printed circuit board able to stably, firmly, and effectively solder narrow leads of semiconductor devices and expansion connectors to the pad apparatus.

These and other objects may be achieved by providing a printed circuit board ("PCB") having a conductive pad formed on a board of the PCB and used for mounting a lead of an electronic device on the board, and a solder deposit formed on the pad and used for electrically connecting the lead of the electronic device to the pad. The pad has a predetermined width and length, and the solder deposit includes first and second end portions shaped and sized to completely cover a predetermined area corresponding to an end portion of the pad and being defined by both the entire width of the pad and a predetermined length from the end of the pad, and a connection web extending between the two end portions and integrating the two end portions into a single structure. The connection web has a longitudinal part having a width smaller than any one of the width of the pad and the width of each of the two end portions.

The solder deposit further includes first and second trapezoidal portions respectively formed at the junctions between opposite ends of the connection web and each one of the two end portions. Each of the two trapezoidal portions is symmetrically and linearly tapered at each opposite side in a manner such that the sides converge from the end portion to the connection web. The connection web has a length corresponding to the length of the lead of the electronic device mounted to the pad. The solder deposit is formed on the pad by using a screen-printing mask including a slit formed at a position corresponding to the position of the solder deposit. The slit having the same shape as the solder deposit includes first and second end opening parts individually shaped and sized to have an end coinciding with an end of the pad, each of the end opening parts also having a width equal to the width of the pad. A web opening part extends between the two end opening parts and allows the two end opening parts to communicate with each other through the web opening part. This web opening part is a longitudinal opening part having a width smaller than any one of both the width of the pad and the width of each of the two end opening parts.

The slit further includes first and second trapezoidal opening parts respectively formed at the junctions between opposite ends of the web opening part and the two end opening parts. Each of the two trapezoidal opening parts is symmetrically and linearly inclined at its opposite side edges in a way such that the side edges converge to the web opening part.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
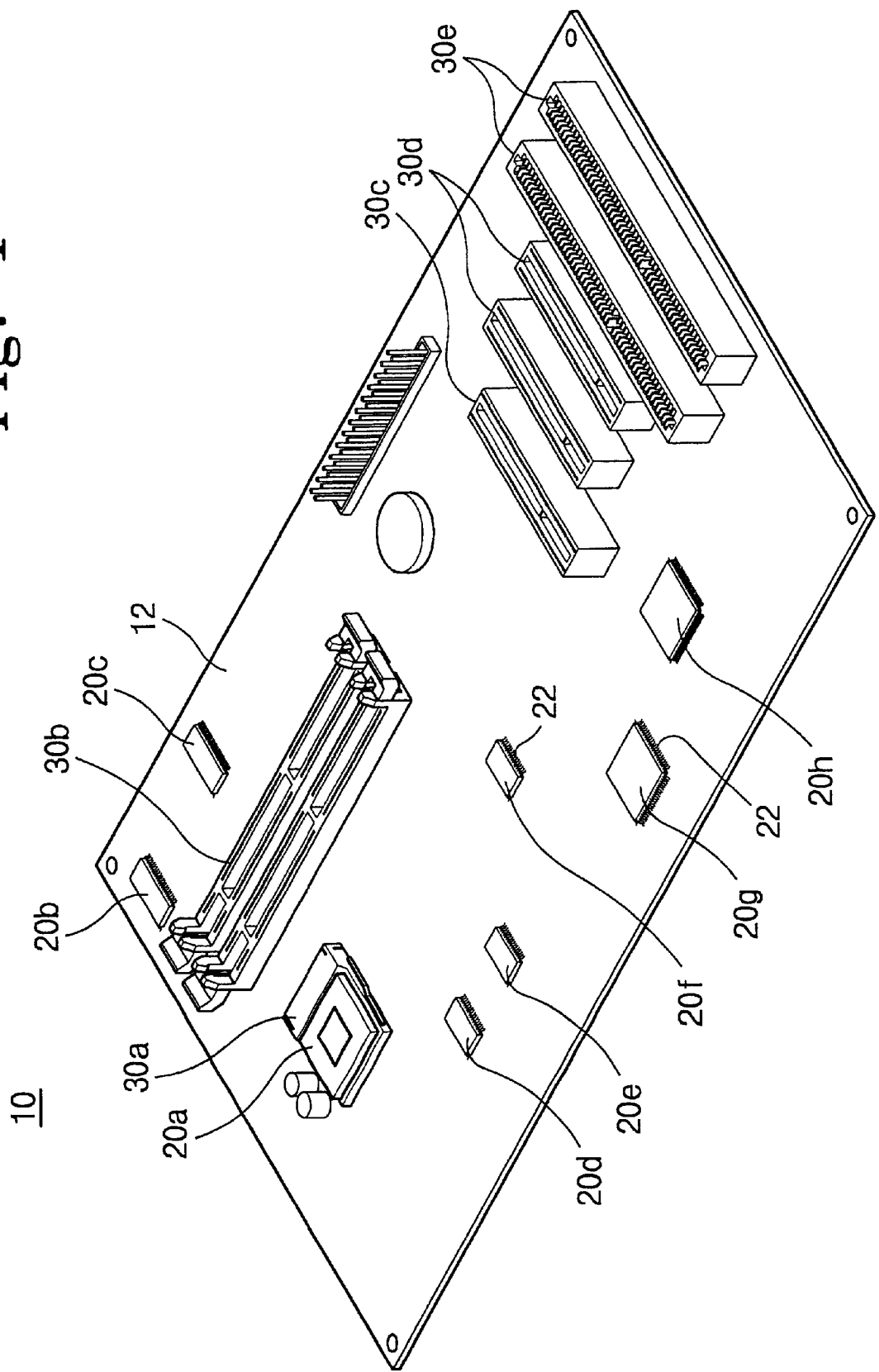
FIG. 1 is a perspective view showing a PCB and a variety of surface mounted devices mounted on the PCB according to the principle of the present invention.
Figure 2:
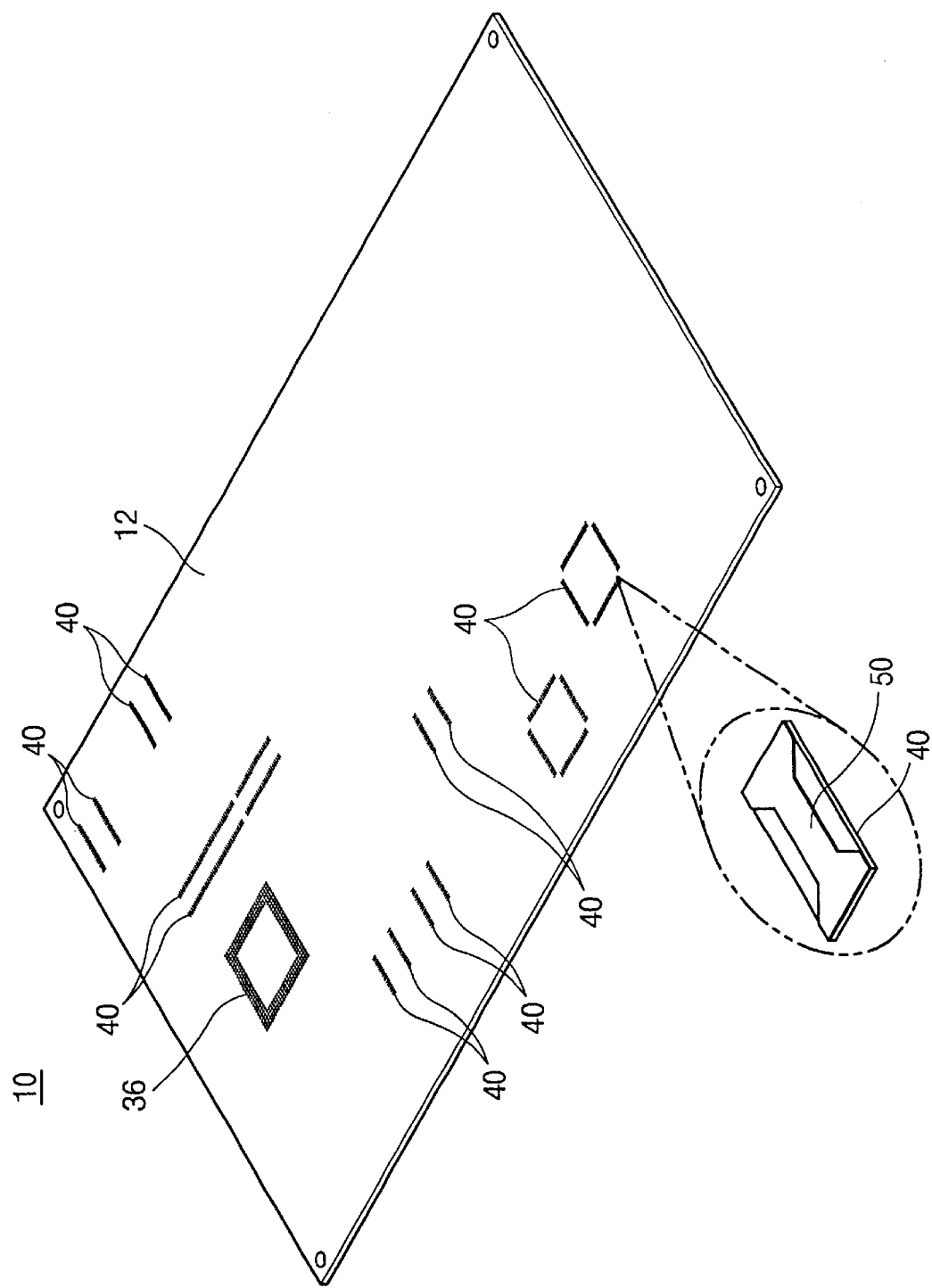
FIG. 2 is a perspective view showing a plurality of pads and solder deposits formed on the PCB of FIG. 1.

Referring flow to FIGS. 1 and 2, a plurality of semiconductor devices 20a, 20b, 20c, 20d, 20e, 20f, 20g and 20h and a plurality of expansion connectors 30a. 30b, 30c, 30d and 30e are mounted on a PCB 10 used for mounting semiconductor devices and connectors of a surface mounted type according to the principle of the present invention. Both semiconductor devices 20a to 20h and connectors 30a to 30e are mounted on PCB 10 by using a surface mounting process or a lead inserting process. PCBs produced according to the present invention may be used for mounting semiconductor devices and connectors of the lead inserted type on the PCBs since the PCBs for such semiconductor devices and connectors also necessarily have solder deposits.

When the semiconductor devices and connectors are mounted on one surface of a board 12 of PCB 10, the semiconductor devices and connectors are seated on board 12 while leads 22 of the devices and connectors are positioned on pads 36 and 40 formed on board 12. PCB 10 used for surface mounted devices and connectors has two types of pads: ball pads 36 for ball grid array packages (BGAPs) and micro ball grid array packages ($\mu$-BGAPs) and fin pads 40 for plastic quad flat packages (PQFPs) and quad flat packages (QFPs). Solder deposit 50 is formed within each one of fin pads 40 or ball pads 36.

Figure 3:
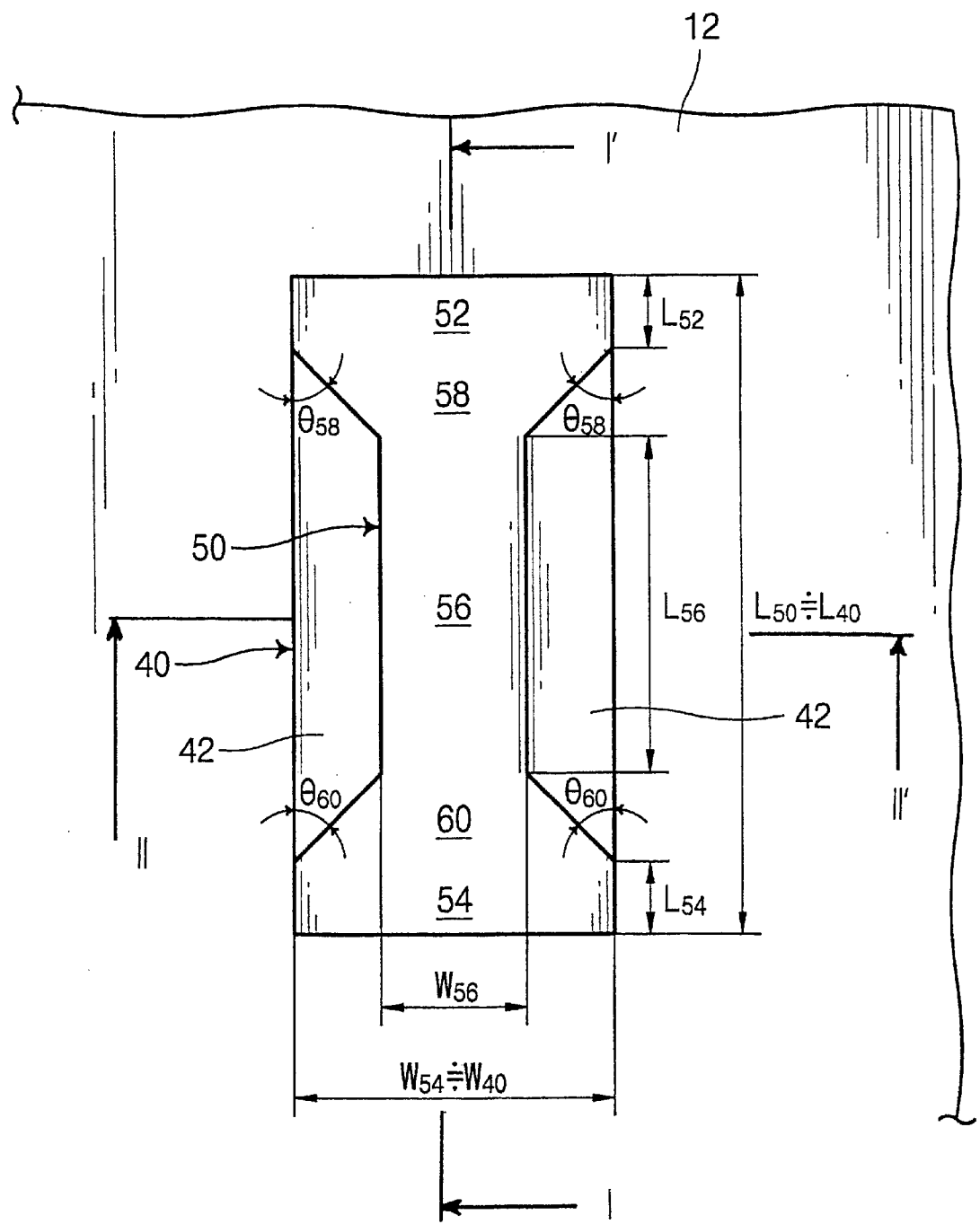
FIG. 3 is a plan view of a pattern of the pad and the solder deposit formed on the pad of the PCB of FIG. 2.
Figure 4:
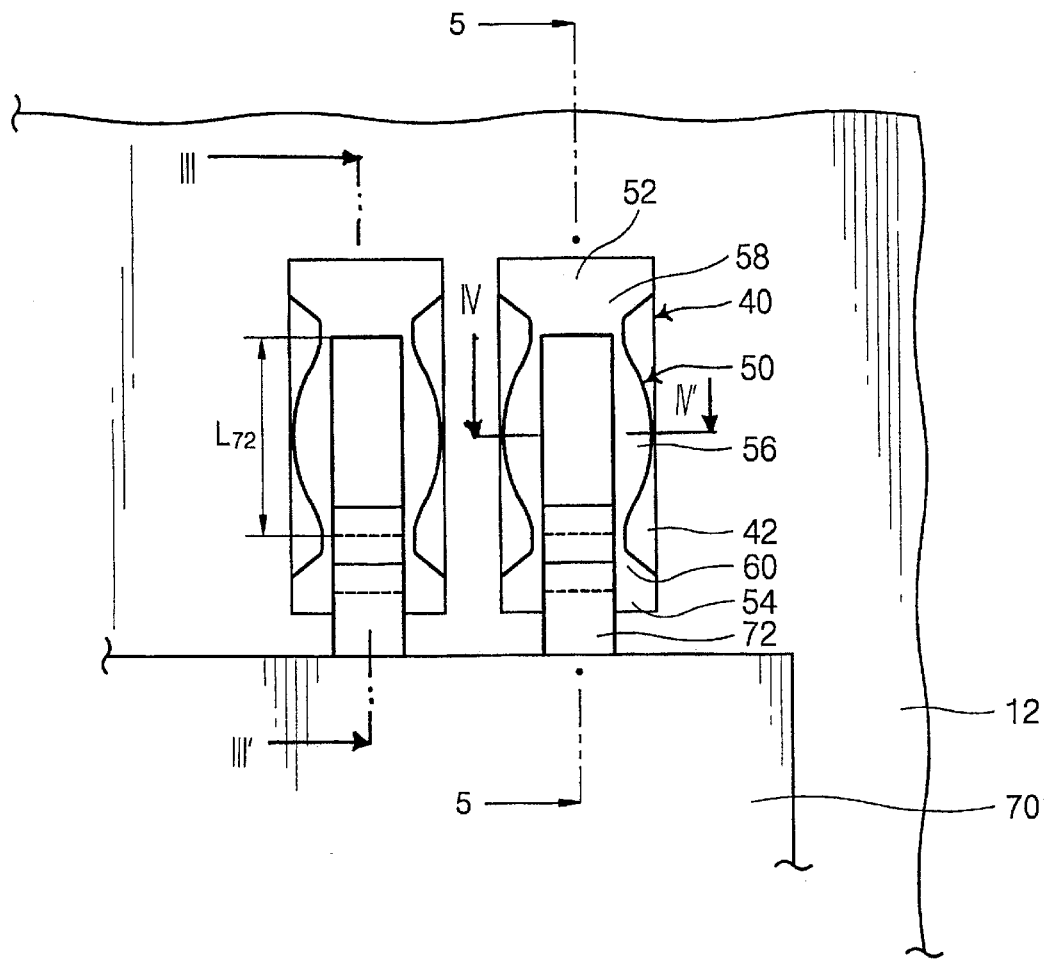
FIG. 4 is a plan view of the pads and leads of a surface mounted device mounted on the PCB.
Figure 5:
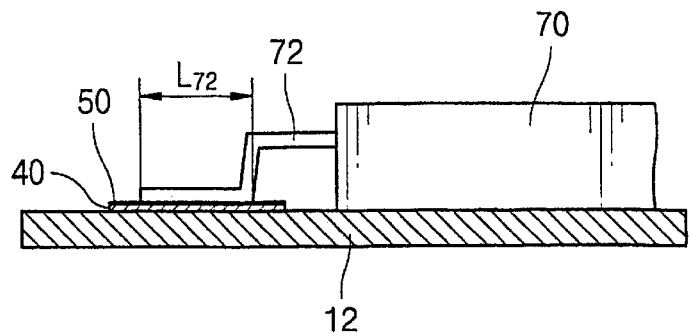
FIG. 5 is a cross-sectional view taken along line 5–5' of FIG. 4.

As shown in FIGS. 3 through 5, PCB 10 includes a board 12, a plurality of pads 40, a plurality of solder deposits 50, and a plurality of semiconductor devices 70. Board 12 is printed with a desired circuit forming a desired electronic system. Pad 40 are formed on board 12 of PCB 10 in accordance with a predetermined rule. Lead 72 of semiconductor devices 70 and the expansion connectors are mounted to pads 40 and electrically assembled with the circuit of the board 12 for predetermined operational functions. Leads 72 of devices 70 are soldered to pads 40 through solder deposits 50. Pads 40 formed on at least one surface of board 12 and used for mounting leads 72 of devices 70 on board 12 have a predetermined width W40 and length L40 and conductive members. Solder deposits 50 are formed on the conductive pads 40 and are used for electrically connecting leads 72 of semiconductor devices 70 to pads 40.

Solder deposit 50 formed on each conductive pad 40 is positioned within both a defined three-dimensional well and a defined solder gap. Both the well and the gap have predetermined shapes. Solder deposit 50 can be formed on pads 40 by using a solid solder or a solder paste. Each solder deposit 50 has an I-shape and consists of two wide end portions 52 and 54 connected together into a single symmetric structure by a connection web 56 narrower than wide end portion. A first wide end portion 52 is shaped and sized to completely cover a predetermined area of a first end portion defined by both entire width W40 of pad 40 and a predetermined length L52 from the first end of the pad 40 while a second end portion 54 is shaped and sized to completely cover a predetermined area of the second end portion defined by both the entire width W40 of the pad 40 and a predetermined length L54 from the second end portion of pad 40. First and second end portions 52 and 54 of solder deposit 50 have the same width W54, which is equal to or slightly smaller than the width W40 of the pad 40.

A connection web 56 is disposed between the two end portions 52 and 54 to integrate the two wide end portions into a single structure and is a longitudinal part having a width W56, which is smaller than any one of both widths W40 and W54. Due to the narrow width of connection web 56 of the solder deposit 50 compared to width W54 of the wide end portions 52, 54, two solder-free portions 42 are formed between the two wide ends and outside connection web of pad 40. Solder-free portions 42 are not filled with the solder during forming of solder, deposit 50 on pad 40.

First and second trapezoidal portions 58 and 60 are respectively formed between one end of connection web 56 and one of wide end portions 52, 54 to connect connection web 56 and both wide end portions 52, 54. Each of two trapezoidal portions 58 and 60 is symmetrically and linearly tapered from one edge of wide end portions 52, 54 to one end of connection web 56. Therefore, the entire length L50 of solder deposit 50 is a sum of length L56 of connection web, lengths L52 and L54 of two end portions 52 and 54, and longitudinal lengths of two trapezoidal portions 58 and 60. In addition, the entire length L50 of solder deposit 50 is equal to or slightly smaller than length L40 of pad 40.

The profile of solder deposit 50 and pad 40 is particularly designed to prevent a screen-printing mask forming solder deposit 50 of pad 40 during a screen printing process from being undesirably blocked during the forming of solid deposit 50 on pad 40 using soldering paste particles. Also, the profile of solder deposit 50 almost completely prevents an undesirable shortage of solder applied to leads 72 of semiconductor device 70 mounted on connection web 56. The formation of trapezoidal portions 58 and 60 allows the soldering paste particles to be reliably and smoothly led to junctions between each wide end portions 52 and 54 and one end of connection web 56 without failure of applying the soldering paste particles to the end portion 52, 54 and connection web 56. When the junctions between each wide end portions 52 and 54 and the one end of connection web 56 are designed to have right-angled corners, the soldering paste pal tides may not smoothly flow at the junctions but block the junctions during the screen-printing process. The junctions prevent the soldering paste particles from being applied through wide end portions 52 and 54 and connection web 56 along the junctions.

In solder deposit 50, side angles $\theta_{58}$ and $\theta_{60}$ formed between a side of pad 40 and a tapered side of trapezoidal portions 58 and 60 are determined by characteristics; of the screen-printing mask. In addition, length L56 of connection web 56 is determined in accordance with a length L72 of a distal end of lead 72 of the semiconductor device 70. The distal end of lead 72 of semiconductor device 70 is disposed on only connection web 56 or both connection web 56 and a portion of trapezoidal portions 58 and 60 adjacent to connection web 56. A central portion of the distal end is located on a central portion of connection web 56. When semiconductor device 70 is mounted on pad 40 of board 12 through solder deposit 50 through a soldering process, it is possible to stably, firmly, and effectively solder lead 72 of semiconductor device 70 to pad 40 without allowing the solder of the solder deposit 50 to undesirably flow over edges of pad 40. A connection portion between wide end portion 52, 54 and trapezoidal portions 58, 60 or between connection web 56 and trapezoidal portions 58, 60 may have a rounded-shape or a curved line. Also, a side of trapezoidal portions 58, 60 may have a curved line.

Figure 6:
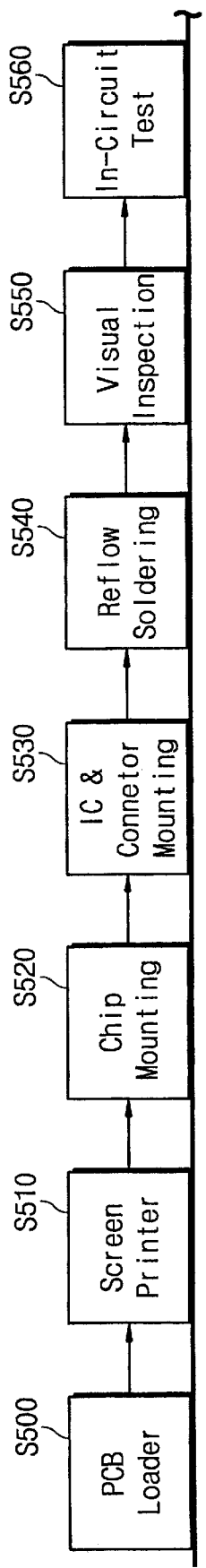
FIG. 6 is a block diagram showing the process of producing the PCB according to the principle of the present invention.

FIG. 6 is a block diagram showing the process of producing PCB 10. A connection of a variety of electronic components to a mass-produced PCB is accomplished by a reflow soldering process or a wave soldering process. Of the two soldering processes, the reflow soldering process has been preferably used for packaging a part of PCB 10. In order to produce desired PCBs, a plurality of PCBs are orderly and continuously fed from a PCB loader to a screen printer using a feeder, such as a conveyor, in step S500 of FIG. 6. In step S510, the screen printer performs a screen-printing step of forming desired solder deposits 50 on a pad 10 of PCB 10 using a mask having a plurality of slits corresponding solder deposit 50. Thereafter, a chip mounting step S520, an IC (integrated circuit) and connector mounting step S530, a reflow soldering step S540, a visual inspection step S550, and an in-circuit test step (S560) are orderly performed to completely produce a desired PCB 10. The apparatus used for forming solder deposits on a PCB is so-called a "screen printer" or a "soldering paste printer". In order to form desired solder deposits on a PCB, such a screen printer is provided with a mask having a plurality of slits formed at positions corresponding to the positions of the desired solder deposits.

Figure 7:
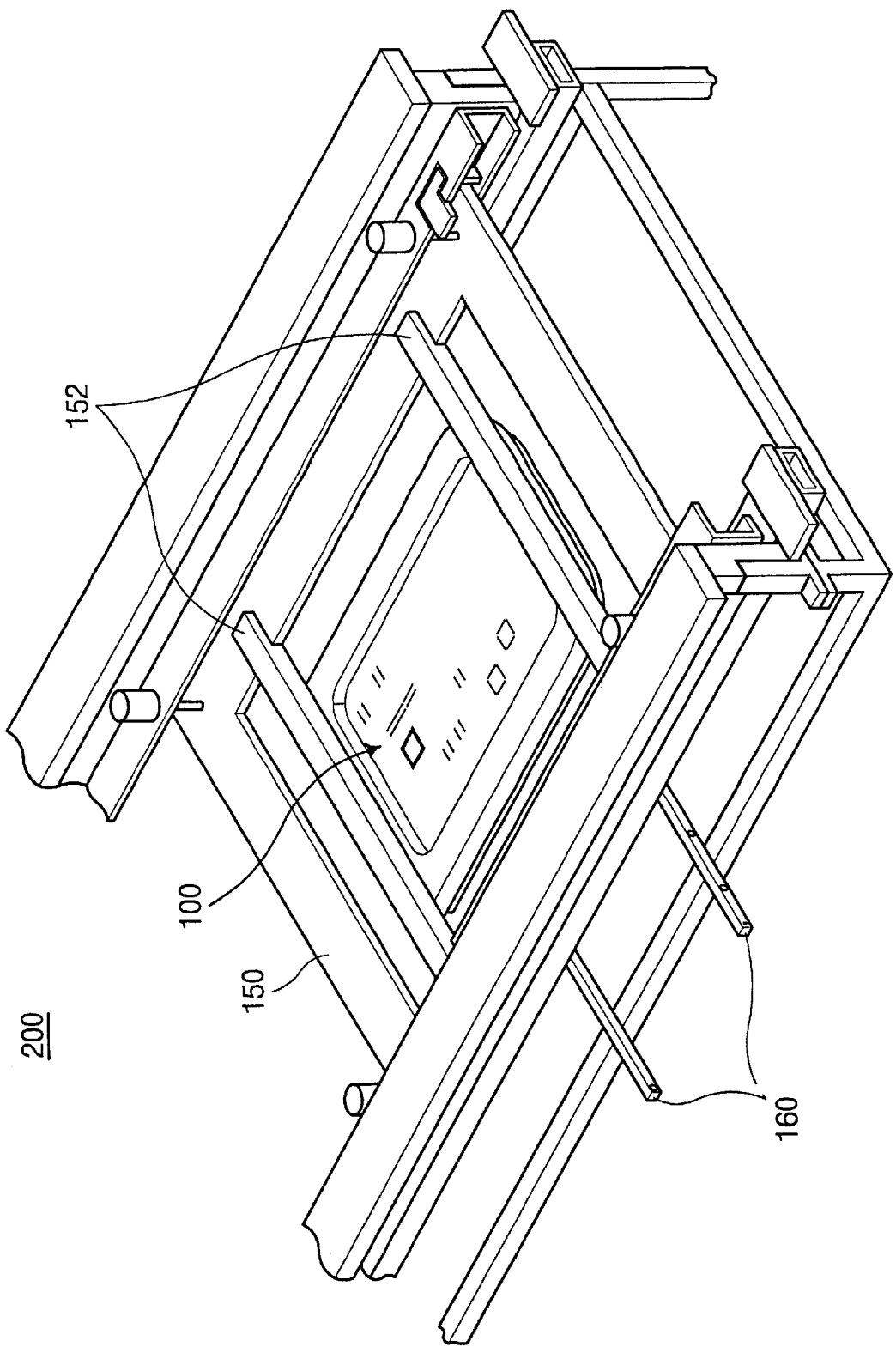
FIGS. 7 and 8 are perspective views showing a screen printer locating a mask on the PCB and forming the solder deposits on the pads of the PCB.
Figure 8:
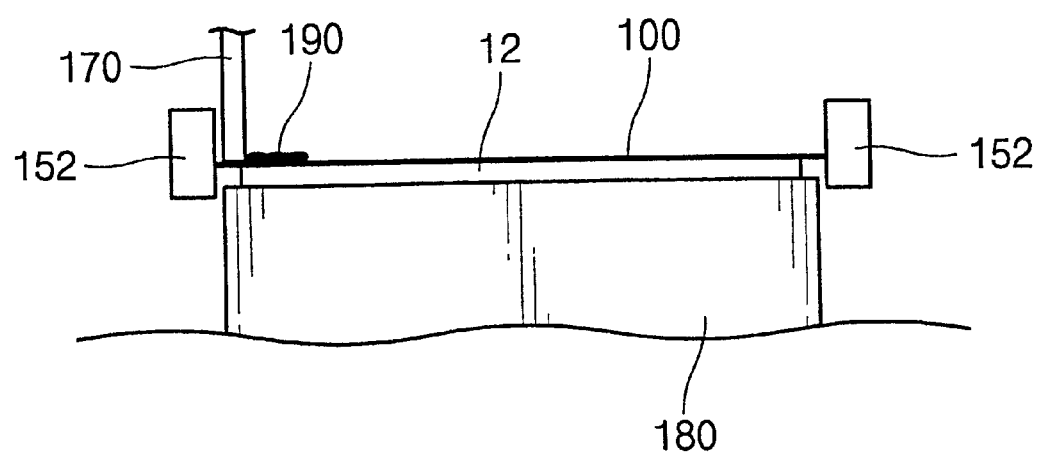

FIGS. 7 and 8 shows the screen printer used for forming desired solder deposits on the PCB of FIG. 2. A mask 100 used for forming desired solder deposits on board 12 of PCB 10 is positioned at a top portion of screen printer 200, and both mask support 150 and two adapters 152 support the mask to be positioned above two board-feeding rails 160. Screen printer 200 includes an upper unit performing a soldering paste bonding process and a lower unit precisely moving in directions of x, y and z axes. A board holder 180 is provided in the lower unit for supporting a board 12 thereon. Board 12 is fed by two board-feeding rails from a PCB loader to screen printer 200. During a process of producing PCB 10, while a board holder 180 holds board 12, the lower unit of screen printer 200 is lifted up until board 12 reaches the upper unit of screen printer 200 by board feeding rails 160 and the lower unit of screen printer 200. The lower unit of screen printer 200 moves board 12 so as to allow board 12 to reach the upper unit of screen printer 200. When the board 12 reaches the upper unit of screen printer 200, a bar 170 applies solder 190 to a pad of BCB through slits formed on mask 100, thus forming desired solder deposits 50 on board 12. Bar 170 moves horizontally and vertically and draws the solder, as a form of solder cream, in the slit of mask 100. The solder cream dropped through the slit is positioned on the pad in a normal temperature. After the screen-printing step is accomplished, semiconductor chips, ICs, and expansion connectors are mounted on board 12 prior to performing a reflow soldering step heating board 12 at a predetermined temperature. After the reflow soldering step is accomplished, a visual inspection step and an in-circuit test step are performed to check the operational reliability of the resulting PCB.

Figure 9:
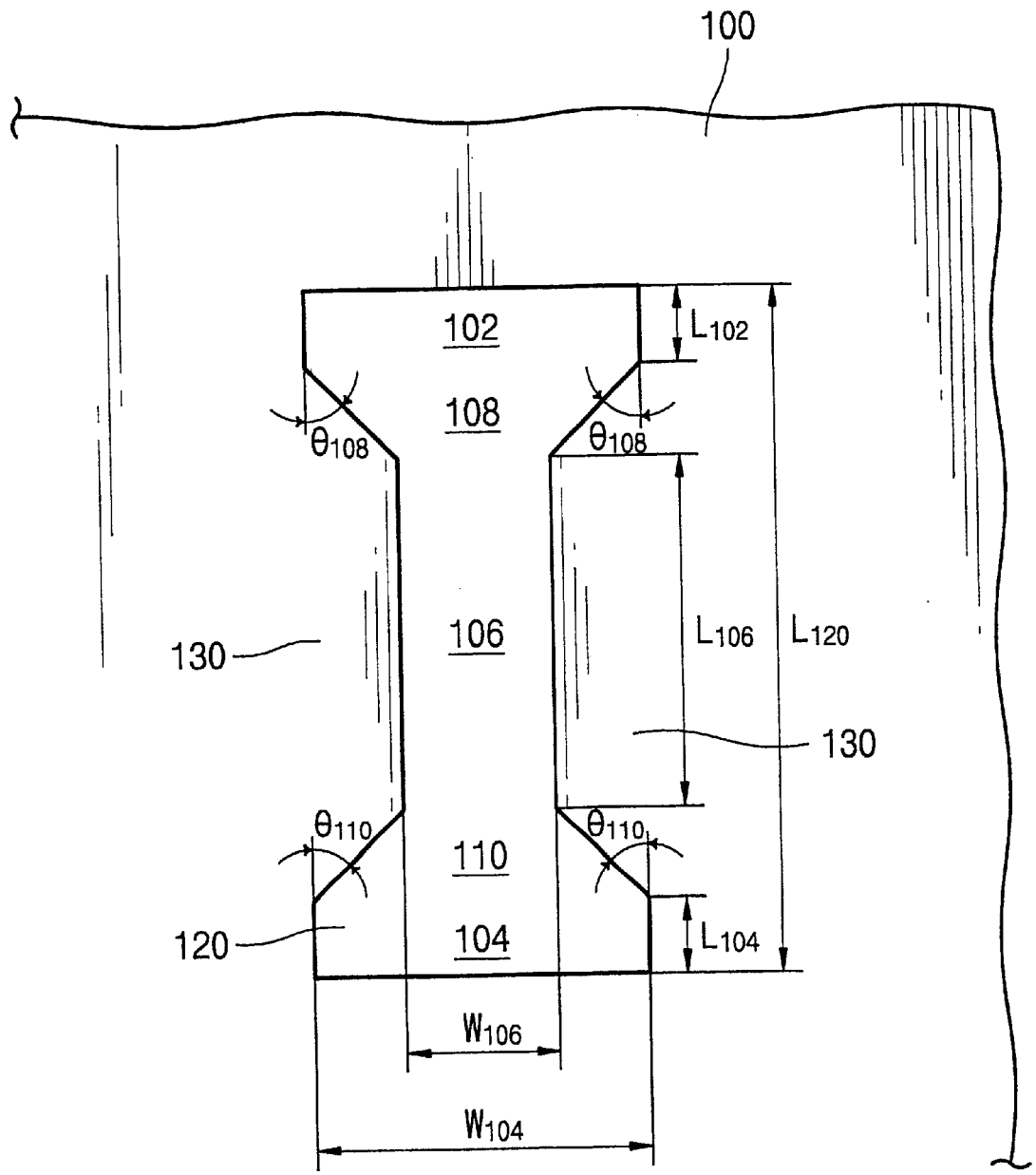
FIG. 9 is a plan view showing a pattern of the mask used for forming a solder deposit on the PCB of FIG. 3.

FIG. 9 shows the profile of a slit of mask 100 describe in screen printer 200 of FIGS. 7 and 8 and used for forming solder deposit 50 of FIG. 3 on the PCB. A plurality of slits 120 are formed on mask 100 at positions corresponding to the positions of solder deposits 50 of FIG. 3. Only one of the slits 120 is shown in FIG. 9. In order to form solder-free portions 42 on both opposite sides of a pad 40, solder shielding parts 130 define opposite side edges of slit 120 formed on a position of a web opening part 106. In order to form wide end portion 52, 54 and trapezoidal portions 58, 60 of solder deposit 50, slit 120 has a first end opening part 102 corresponding to first wide end portion 52, a second end opening part 104 corresponding to second wide end portion 54, web opening part 106 corresponding to connection web 56, and two trapezoidal opening parts 108 and 110 corresponding to two trapezoidal portions 58 and 60. Opening parts 102, 104, 106, 108 and 110 communicate with each other to form slit 120 in order to form an I-shaped profile coinciding with the profile of solder deposit 50.

In slit 120, first and second end opening parts 102 and 104 have the same width W104, which is equal to or slightly smaller than width W40 of pad 40. On the other hand, web opening part 106 extending between two end opening parts 102, 104 and integrating two end opening parts 102, 104 into a single slit is a longitudinal opening having a width W106, which is smaller than any one of both widths W40 and W104. Due to the narrow web opening part 106, two solder shielding parts 130 define the opposite side edges of slit 120 at a position of web opening part 106 and form solder-free portions 42 on opposite side portions of pad 40. On the other hand, first and second trapezoidal opening parts 108, 110 are respectively formed at the junctions between one end of web opening part 106 and one of two end opening parts 102, 104. Each of two trapezoidal opening parts 108, 110 is symmetrically and linearly tapered from one end of two end opening parts 102, 104 to each side edges of web opening part 106 in a way such that the side edges of end opening parts 102, 104 converge into web opening part 106.

Therefore, the entire length L120 of slit 120 is a sum of length L106 of web opening part 106, lengths L102 and L10 of two end opening parts 102, 104, and the longitudinal lengths of two trapezoidal opening parts 108 and 110. In addition, the entire length L120 of slit 120 is equal to or slightly smaller than length L40 of pad 40. Such a specifically designed profile of slit 120 is particularly to prevent the junctions between each end of web opening part 106 and one of two end opening parts 102, 104 from being undesirably blocked by solder. The soldering paste particles have diameters from 50 $\mu$m (microns) to 100 $\mu$m. The soldering paste particles block the junctions between the opposite ends of the web opening part 106 and two end opening parts 102, 104 if the junctions have a form of a right-angled corner, and cause the deformation of solder deposit 50. In slit 120, angles formed between the tapered side of trapezoidal opening parts 108 ($\theta_{108}$), 110 ($\theta_{110}$) and a side of pad 40 is preferably set to a range of 42 degrees to 48 degrees. It is more preferable to set each of the angles $\theta_{108}$, $\theta_{110}$ to 45 degrees. Such an angle of the tapered side of two trapezoidal opening parts 108, 110 maybe appropriately set in accordance with diameters of the soldering paste particles and working conditions of the screen-printing process.

Figure 10A:
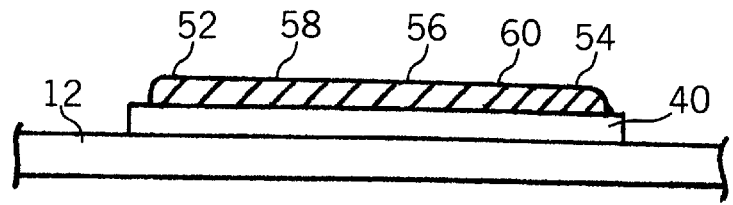
FIGS. 10A and 10B are cross-sectional views taken along lines I–I' and II–II' respectively of FIG. 3.
Figure 10B:
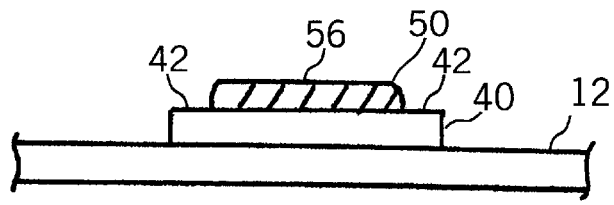
Figure 10C:
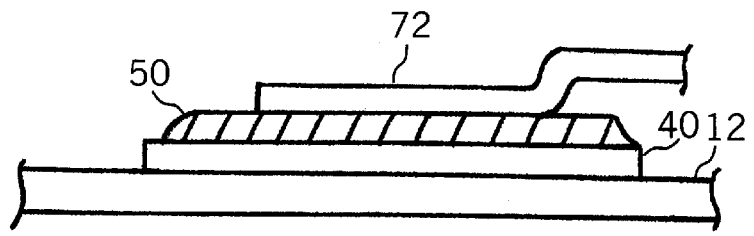
FIGS. 10C and 10D are cross-sectional views taken along lines III–III' and IV–IV', respectively of FIG. 4.
Figure 10D:
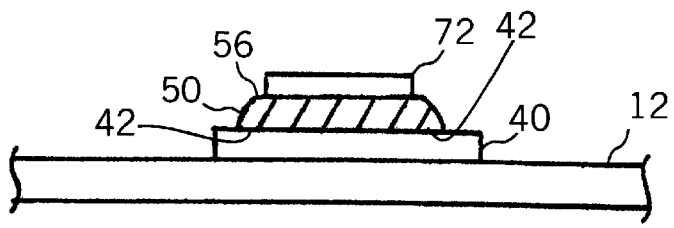

FIGS. 10A and 10B shows cross-sectional views of solder pad 40 formed on PCB 12 and taken along I–I' and II–II' respectively. Two solder-free portions 42 are not covered by the solder, such as the solder cream. FIGS. 10C and 10D shows cross-sectional views of lead 72 and solder pad 40 after the reflow soldering step and taken along III–III' and IV–IV', respectively. A portion of each solder-free portion 42 is covered by the solder as shown in FIG. 10D.

As described above, a PCB having a pad formed on a board of the PCB and a mask used for screen-printing a solder deposit on the pad according to the principle of the present invention completely prevent the adjacent leads of semiconductor devices or of expansion connectors having a small lead pitch from being electrically connected together by solder during a soldering process of mounting the semiconductor devices or the connectors on the pad of the PCB. Moreover, the solder deposit formed on the pad of the PCB stably, firmly and effectively solders the leads of semiconductor devices and expansion connectors to the pads of the PCB without allowing the solder from undesirably flowing over the edges of the pads when the semiconductor devices and connectors are mounted to the pads by the solder deposit through a soldering process.

Although an embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A printed circuit board, comprising:
   a board;
   a pad formed on one surface of said board; and
   a solder deposit formed on said pad, said solder deposit including:
   a plurality of end portions having a first width;
   a middle portion connected between said end portions, having a second width narrower than said first width of said end portions; and
   a plurality of tapered portions having a third width gradually varying from said first width to said second width, each connected between one of said end portions and one end of said middle portion.

2. The printed circuit board of claim 1, said tapered portions having a first side line having an angle ranging 42 degrees to 48 degrees with respect to a second side line of said middle portion.

3. The printed circuit board of claim 1, said pad having a fourth width greater than or equal to any one of said first width, said second width, and said third width.

4. The printed circuit board of claim 1, said pad having a length greater or equal to a sum of lengths of said end portions, said middle portion, said tapered portions.

5. The printed circuit board of claim 1, said solder deposit being made of a conductive single body.

6. The printed circuit board of claim 1, said solder deposit comprising a solder formed on an entire area of said solder deposit with a predetermined thickness.

7. The printed circuit board of claim 1, said solder deposit comprising a rounded portion between said middle portion and said tapered portion.

8. The printed circuit board of claim 1, said solder deposit comprising a rounded portion between one of said tapered portions and one of said end portions connected to said one of said tapered portions.

9. The printed circuit board of claim 1, said middle portion comprising a length greater than said second width.

10. The printed circuit board of claim 1, said middle portion having said second width greater than or equal to a half of said first width.

11. The printed circuit board of claim 1, said middle portion having said second width less than or equal to a half of said first width.

12. The printed circuit board of claim 1, said tapered portions having a trapezoidal shape.

13. The printed circuit board of claim 1, said tapered portions being the same shape as a cross section of a frustum.

14. The printed circuit board of claim 1, said tapered portion including a curved line formed between said middle portion and one of said end portion.

15. The printed circuit board of claim 1, further comprising at least one nonconductive portion formed on said pad, disposed outside said solder deposit.

16. The printed circuit board of claim 15, said nonconductive portion formed between side lines of said tapered portions, disposed outside said middle portion.

17. The printed circuit board of claim 1, further comprising an electronic device having at least one lead, a distal end of said lead disposed within said middle portion of said solder deposit.

18. The printed circuit board of claim 17, said solder deposit disposed within said pad without flowing over outside said pad after soldering said lead to said pad.

19. The printed circuit board of claim 17, said second width of said middle portion greater than a fourth width of said lead of said electronic device.

20. The printed circuit board of claim 17, said distal end having a length less than said middle portion.

21. The printed circuit board of claim 1, further comprising a semiconductor having at least one lead, a distal end of said lead disposed on said middle portion and said tapered portions of said solder deposit.

22. The printed circuit board of claim 1, further comprising a mask disposed above said board to form said solder deposit, said mask having a slit having end openings corresponding to said end portions and middle opening corresponding to said middle portion.

23. The printed circuit board of claim 22, further comprising tapered openings each corresponding to tapered portions having a third width gradually varying said first width to said second width, said tapered portions each disposed between one of said end portions and one end of said middle portion to couple said middle portion to said end portions.

24. The printed circuit board of claim 22, said mask removed from said board after a solder is applied to said pad through said slit of said mask to form said solder a deposit.

25. A printed circuit board, comprising:

a board;

a conductive pad formed on a surface of said board and used for mounting a lead of an electronic device on said board, having a first width and a first length; and a solder deposit formed on said conductive pad and used for electrically connecting a distal end of said lead of said electronic device to said conductive pad, said solder deposit comprising:

a first end portion covering a first end area of said pad, said first end area defined by both an entire said first width of the pad and a predetermined length of said first length from a first end line of said pad;

a second end portion covering a second end area of said pad opposite to said first end portion, said second end area defined by both an entire said first width of said pad and a predetermined length of said first length from a second end line of said pad;

a connection web extending between said first and second end portions, integrating said two end portions into a single structure, having a second width smaller than any one of both said first width of said pad and a second width of each of said two end portions; and first and second trapezoidal portions each formed at each junction between said connection web and one of said two end portions, each having two tapered sides.

26. The printed circuit board of claim 25, said first and second trapezoidal portions each having a side line having an angle ranging 42 degrees to 48 degrees with respect to a longitudinal side line of said connection web.

27. The printed circuit board of claim 25, said connection web having a length corresponding to a length of said lead of the electronic device mounted to the pad.

28. The printed circuit board of claim 25, further comprising a mask disposed above said board to form said solder deposit, said mask having a slit having end openings corresponding to said end portions and middle opening corresponding to said connection web.

29. The printed circuit board of claim 25, further comprising a mask disposed above said board to form said solder deposit and removed after forming said solder deposit, said mask having a slit having end openings corresponding to said end portions, middle opening corresponding to said connection web, and first and second trapezoidal openings corresponding to said first and second trapezoidal portions.

30. The printed circuit board of claim 29, said first and second trapezoidal portions each having a side line having an angle ranging 42 degrees to 48 degrees with respect to a longitudinal side line of said connection web.

31. A method, comprising the steps of:

providing a printed circuit board having a pad;

providing a mask having a slit formed on said mask, said slit having two end openings, a middle opening disposed between said end openings, and two tapered openings each disposed between said middle opening and one of said end openings;

locating said printed circuit board below said mask so as to dispose said slit within said pad;

applying a solder to said pad through said slit of said mask; and forming a solder deposit on said pad, said solder deposit including first and second end portions covering first and second end areas of said pad and corresponding to said end openings, a connection web extending between said first and second end portions, integrating said two end portions into a single structure, and having a second width smaller than any one of both said first width of said pad and a second width of each of said two end portions, and first and second trapezoidal portions each formed at each junction between said connection web and one of said two end portions, each having two tapered sides.

* * * * *